United States Patent
Kim et al.

(10) Patent No.: US 7,834,463 B2
(45) Date of Patent: Nov. 16, 2010

(54) STACK PACKAGE HAVING PATTERN DIE REDISTRIBUTION

(75) Inventors: Sung Min Kim, Seoul (KR); Min Suk Suh, Seoul (KR); Kwon Whan Han, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 288 days.

(21) Appl. No.: 11/647,621

(22) Filed: Dec. 29, 2006

(65) Prior Publication Data

US 2008/0001304 A1  Jan. 3, 2008

(30) Foreign Application Priority Data

Jun. 30, 2006  (KR) .................. 10-2006-0061287

(51) Int. Cl.
*H01L 25/065* (2006.01)
(52) U.S. Cl. ............. 257/777; 257/686; 257/E25.013
(58) Field of Classification Search ............. 257/723, 257/777, 782, 692, 784, E25.013
See application file for complete search history.

(56) References Cited

U.S. PATENT DOCUMENTS

| | | | | |
|---|---|---|---|---|
| 6,316,838 B1 * | 11/2001 | Ozawa et al. | .............. | 257/778 |
| 6,812,575 B2 * | 11/2004 | Furusawa | .................. | 257/774 |
| 6,979,905 B2 * | 12/2005 | Nishida et al. | .............. | 257/777 |
| 7,327,038 B2 * | 2/2008 | Kwon et al. | ................. | 257/777 |
| 2006/0267173 A1 * | 11/2006 | Takiar et al. | ................ | 257/686 |

FOREIGN PATENT DOCUMENTS

KR  1020040070020  8/2004

* cited by examiner

*Primary Examiner*—Jerome Jackson, Jr.
*Assistant Examiner*—Yu Chen
(74) *Attorney, Agent, or Firm*—Ladas & Parry LLP

(57) ABSTRACT

A stack package includes an edge-pad-type first semiconductor chip having bonding pads arranged near the edges thereof. A pattern die is placed on the first semiconductor chip. The pattern die is smaller in size than the first semiconductor chip and has line-type-redistribution parts formed thereon. An edge-pad-type second semiconductor chip smaller in size than the pattern die is placed on the pattern die. Bonding wires electrically connect the bonding pads of the first semiconductor chip and the redistribution parts of the pattern die and also electrically connect the redistribution parts of the pattern die and bonding pads of the second semiconductor chip.

6 Claims, 3 Drawing Sheets

STACK PACKAGE HAVING PATTERN DIE REDISTRIBUTION

CROSS-REFERENCE TO RELATED APPLICATIONS

The present application claims priority to Korean patent application number 10-2006-0061287 filed on Jun. 30, 2006, which is incorporated herein by reference in its entirety.

BACKGROUND OF THE INVENTION

The present invention relates to a semiconductor package, and more particularly to a stack package, which employs a pattern die having redistribution parts.

As is generally known in the art, the semiconductor packaging technology has been focused on ways to mount more number of packages on a limited-size substrate and thereby to decrease the relative size of a package. A chip size package and a ball grid array (BGA) package are typical examples.

In addition to reducing size, the recent trend in the packaging technology is directed to achieving the desired high capacity by packaging at least two or more semiconductor chips into a single package. For example, vigorous studies are being made for development of a stack package and a multi-chip package (MCP) in which a plurality of semiconductor chips are vertically or horizontally placed on a substrate.

However, these types of conventional stack packages and the MCPs utilize bonding wires to electrically connect a plurality of semiconductor chips that are vertically stacked. As a consequence, the thickness of the entire package becomes undesirably thick, and the reliability and the yield of the package are adversely influenced by the bonding wire sweep and shorts in a molding process. Further, as the length of the bonding wire increases, the electrical characteristics of the package are likely to be deteriorated. In order to overcome these problems, a technique for manufacturing an MCP using some form of redistribution layers has been disclosed in Korean Patent Application No. 10-2003-0087282.

FIG. 1 is a cross-sectional view of the MCP disclosed in the above patent reference. Two pairs of semiconductor chips 2a, 2b and 2c, 2d each chip having redistribution layers (not shown) are attached to the upper and lower surfaces, respectively, of a die paddle 3. The redistribution layers for each of the semiconductor chips 2a, 2b, 2c, 2d are electrically connected to inner leads 4 by bonding wires 6 and to the other chip on the same surface of the die paddle 3 by bonding wires 7. The semiconductor chips 2a, 2b, 2c, 2d, the die paddle 3, the inner leads 4, and the bonding wires 6, 7 are encapsulated by a molding material 8. The reference numeral 5 designates outer leads.

Since the MCP is constructed using semiconductor chips having redistribution layers, the overall thickness of the package can be decreased when compared to the conventional art, and the problem caused due to sweeping of bonding wires can be substantially solved. Also, as the length of the bonding wire decreases, the electrical characteristics of the package can be improved when compared to the conventional art.

Nevertheless, in the MCP as described above, since the redistribution layers must be formed on the semiconductor chips which are actually driven and at least two-layered redistribution structure must be formed, it is difficult to form the redistribution layers.

Moreover, in another type of MCP different from the MCP described above, even though redistribution layers are formed, when it is required to form a stack of chips only through wire bonding, it may be necessary to connect oppositely positioned bonding pads. If the oppositely positioned bonding pads are connected to one another using elongated bonding wires 23 and 24 as shown in FIG. 2 or using a separate substrate (not shown), the process margin may decrease. Therefore, a stable electrical connection cannot be formed only through forming of redistribution layers. In FIG. 2, the reference numerals 20, 22 designate semiconductor chips, and the reference numeral 21 is an adhesive.

Further, in case of forming electrical connections using redistribution layers, the electrical connections in the same direction do not cause any problem. However, when interconnecting the oppositely positioned bonding pads, since the two-layered redistributions should be used, it is actually difficult to use the redistributions.

SUMMARY OF THE INVENTION

The present invention is directed to a stack package in which redistribution parts can be easily formed.

Also, the present invention is directed to a stack package in which electrical connections can be easily formed.

In one embodiment, a stack package comprises an edge-pad-type first semiconductor chip having bonding pads arranged adjacent to edges thereof; a pattern die placed on the first semiconductor chip, having a size smaller than the first semiconductor chip, and possessing a plurality of line-type redistribution parts on an upper surface thereof; an edge-pad-type second semiconductor chip placed on the pattern die and having a size smaller than the pattern die; and bonding wires for electrically connecting the bonding pads of the first semiconductor chip and the redistribution parts of the pattern die and for electrically connecting the redistribution parts of the pattern die and bonding pads of the second semiconductor chip.

The pattern die is placed on the first semiconductor chip in such a way as to expose the bonding pads of the first semiconductor chip.

The second semiconductor chip is placed on the pattern die in such a way as to expose both lengthwise ends of the redistribution parts of the pattern die.

The bonding wires connect the bonding pads of the first semiconductor chip and the redistribution parts, which adjoin each other, and the redistribution parts and the bonding pads of the second semiconductor chip, which adjoin each other.

DESCRIPTION OF SPECIFIC EMBODIMENTS

The semiconductor chips of the present invention are stacked by using an unprocessed pattern die having redistribution parts formed thereon. The bonding pads of the stacked semiconductor chips are electrically connected to one another by the bonding wires via the redistribution parts of the pattern die.

In this case, the pattern die having the redistribution parts is interposed in between two stacked semiconductor chips, and the electrical connections between the semiconductor chips (that is, between the bonding pads of the stacked semiconductor chips) are formed via the redistribution parts of the pattern die. Therefore, regardless of where the bonding pads are located in each chip, the electrical connection between the stacked chips can be easily formed by using the pattern die in between. In particular, due to the fact that the electrical connections between the stacked chips are formed by the redistribution parts of the pattern die and the bonding wires having a short length are used to connect the bonding pads and the redistribution parts with each other, the electrical characteristics of the final stack package are improved.

Figure 1:
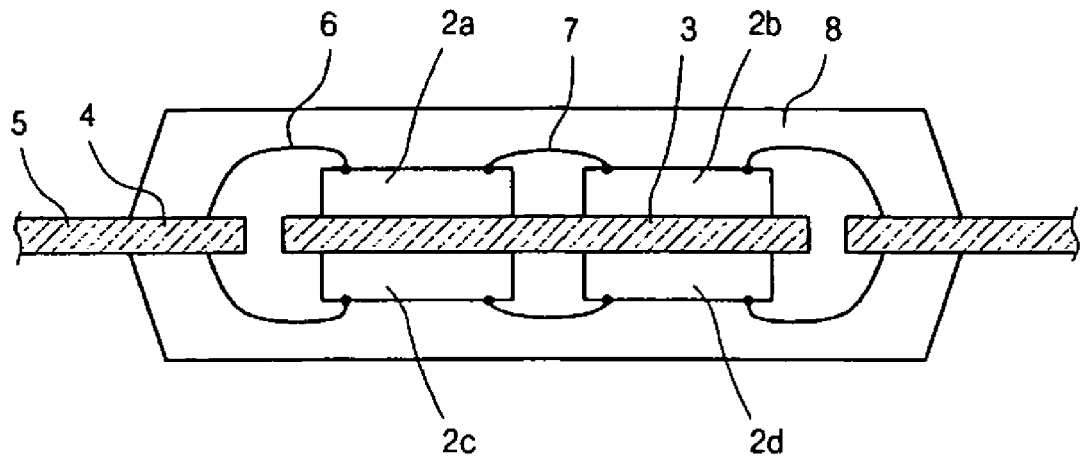
FIG. 1 is a cross-sectional view illustrating a conventional multi-chip package.
Figure 2:
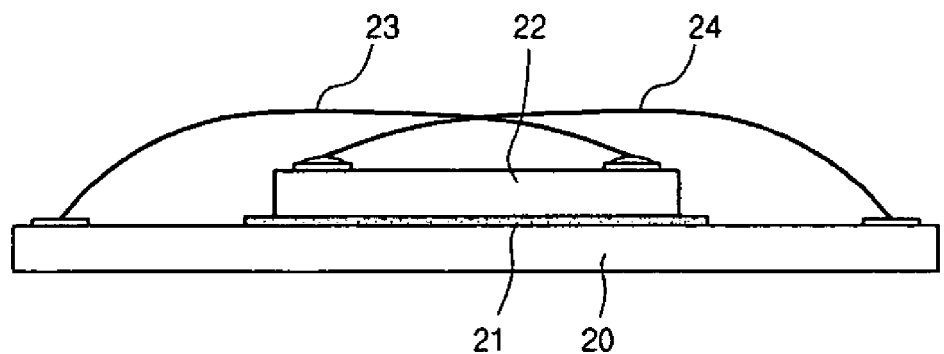
FIG. 2 is a cross-sectional view for explaining a problem caused in the conventional art.
Figure 3:
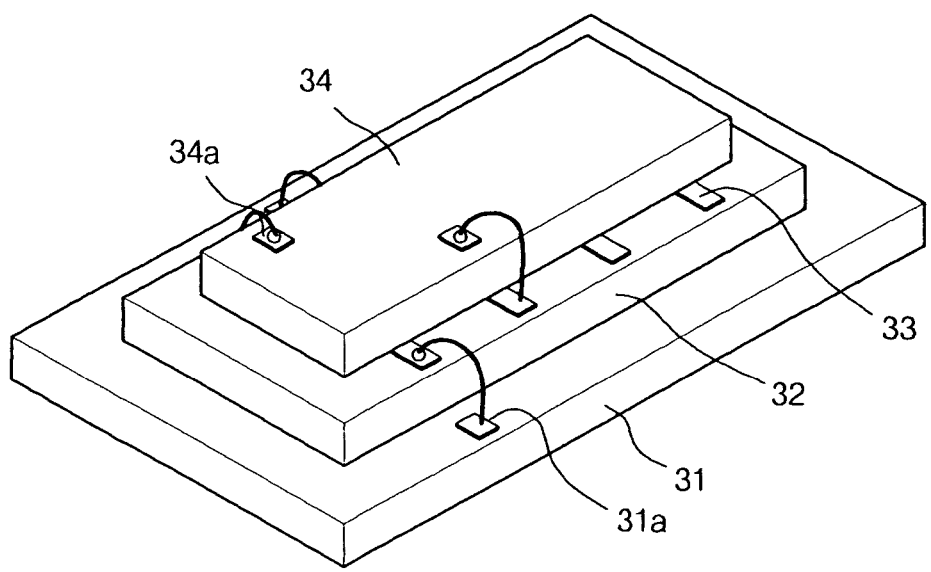
FIG. 3 is a perspective view illustrating a stack package in accordance with an embodiment of the present invention.
Figure 4:
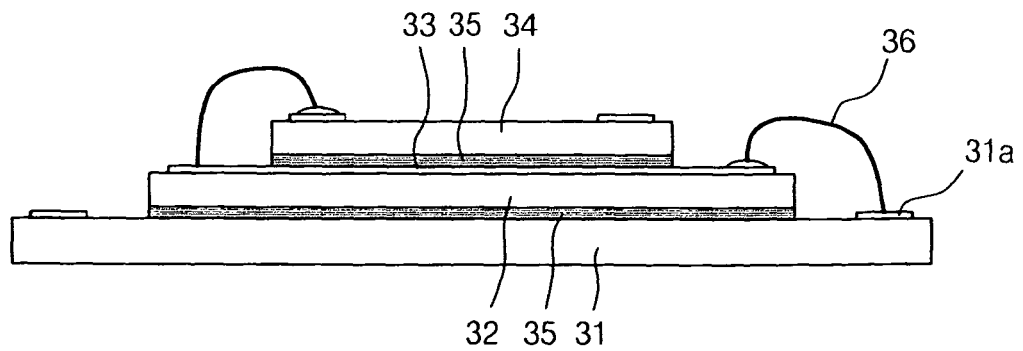
FIG. 4 is a cross-sectional view illustrating the stack package in accordance with the embodiment of the present invention.
Figure 5:
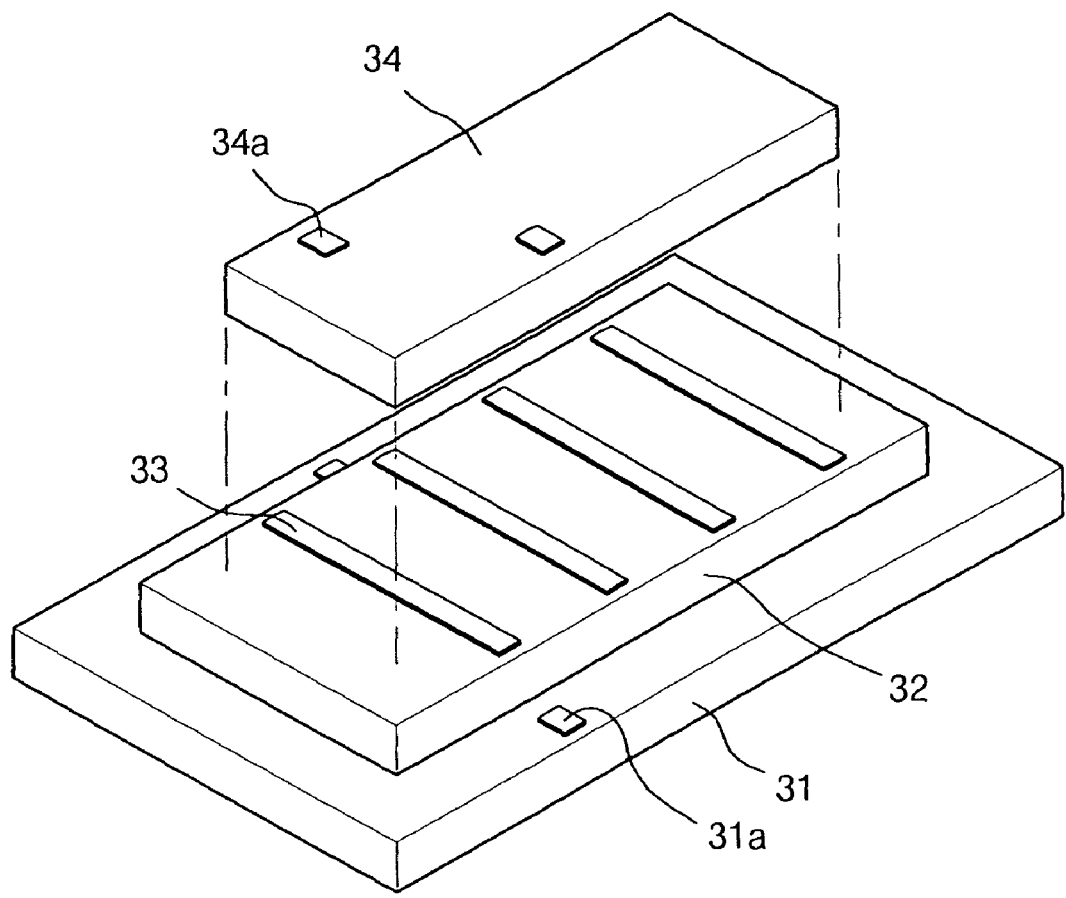
FIG. 5 is an exploded perspective view illustrating the stack packaged in accordance with the embodiment of the present invention.

FIGS. 3-5 show the structure of the stack package according to an embodiment of the present invention.

An edge-pad-type first semiconductor chip 31 has first bonding pads 31a arranged on locations near or adjacent the edges of the first semiconductor chip 31. A pattern die 32 has a plurality of line-type redistribution parts 33, and the pattern die 32 is adhered to the first semiconductor chip 31 by an adhesive 35.

The pattern die 32 is an electrical connection member, which is an unprocessed bare chip having the line type redistribution parts 33 formed thereon, and it is smaller in size than the first semiconductor chip 31. In particular, the pattern die 32 is positioned on the first semiconductor chip 31 without covering the first bonding pads 31a. The redistribution parts 33 of the pattern die 32 can be individually designed depending on the positions of the bonding pads 31a, 34a of first and second semiconductor chips 31, 34.

An edge-pad-type second semiconductor chip 34, has second bonding pads 34a arranged on the locations near or adjacent the edges of the second semiconductor chip 34, which is adhered to the pattern die 32 by an adhesive 35. The second semiconductor chip 34 smaller in size than the pattern die 32 is positioned on the pattern die 32 without covering up the end portions of each of the redistribution parts 33.

The first bonding pads 31a of the first semiconductor chip 31 are electrically connected to the redistribution parts 33 of the pattern die 32 by the bonding wires 36, and the redistribution parts 33 of the pattern die 32 are electrically connected to the second bonding pads 34a of the second semiconductor chip 34 by the bonding wires 36.

Here, in an embodiment of the present invention, each electrical connection formed by a bonding wire 36 is designed to connect the bonding pad and the redistribution part that are located proximally close to each other, and this facilitates simplified formation of the electrical connections between the two stacked chips 31, 34. Further, the length of the bonding wire 36 becomes shorter, and this helps to improve the electrical characteristics of the finally manufactured package.

In particular, because unprocessed chips are used for the pattern dies 32 according to an embodiment of the present invention, the formation and/or the use of the redistribution parts 33 become easier and more convenient. Further, two bonding pads that are located at the opposite ends of the stacked chips can easily be connected by connecting each bonding pad to the proximally located redistribution part and by connecting the redistribution parts each of which is connected to the one of the bonding pads that are oppositely located. Therefore, the electrical connections between the oppositely positioned bonding pads become easier without having to adopt a two-layered redistribution structure.

Further, the possibility of producing defective packages due to bond wire sweeps and shorts occurring in a molding process are fundamentally eliminated, and this helps to secure a sufficient process margin for a high production yield.

In order to manufacture the stack package according to an embodiment of the present invention, the pattern die having the plurality of line-type redistribution parts is prepared. Then, the pattern die is adhered to the edge-pad-type first semiconductor chip. The edge-pad-type second semiconductor chip is then adhered to the pattern die, and each pair of the bonding pad and the redistribution part that are located proximally close to each other are wire-bonded in a desired pattern.

In producing the stack package according to an embodiment of the present invention, a pattern die having a plurality of line-type redistribution parts are prepared. Then, the pattern die is adhered to the edge-pad-type first semiconductor chip by using an adhesive. The edge-pad-type second semiconductor chip is then adhered to the pattern die using an adhesive. Each pair of the proximally located bonding pad and a portion of the redistribution part are wire bonded. These steps for adhering the second semiconductor chip and the pattern die and the first semiconductor chip is performed on the first semiconductor chip that is securely attached to a substrate.

After stacking and wire-bonding of the semiconductor chips are completed, the bonding wires, and the first semiconductor chip, the pattern die, and the second semiconductor chip, all of which are stacked on each other, are sealed in a molding process, and then solder balls are formed on the lower surface of the substrate.

As is apparent from the above description, the stack package according to the present invention provides advantages in that semiconductor chips are stacked using a pattern die having redistribution parts, and the bonding pads of the semiconductor chip and the redistributions are wire-bonded to each other. As a result, the redistribution parts can be easily formed, and electrical connections can be easily made through wire-bonding.

Also, in the present invention, because the electrical connections are formed using the redistribution parts, it is possible to decrease the length of the bonding wires, and the problem caused due to sweeping of bonding wires in a molding process can be solved. Further, as a short electric signal path is provided, the electrical characteristics of an end product can be improved.

In the drawings and specification, there has been disclosed a specific embodiment of the invention and, although specific terms are employed, they are used in a generic and descriptive sense only and not for purposes of limitation, the scope of the invention being set forth in the following claims.

What is claimed is:

1. A stack package comprising:
    an edge-pad-type first semiconductor chip having first bonding pads along edges of the first semiconductor chip;
    a pattern die smaller than the first semiconductor chip and mounted onto the first semiconductor chip wherein the pattern die has a plurality of linear redistribution parts formed thereon, each linear redistribution part is aligned laterally across the pattern die so that opposing end parts of each redistribution part are positioned along respective opposing edges of the pattern die;
    an edge-pad-type second semiconductor chip smaller in size than the pattern die and mounted onto the pattern die such that the pattern die is sandwiched between the first and second semiconductor chips in which portions of the linear redistribution parts of the pattern die are covered over by the second semiconductor chip, wherein the second semiconductor chip having second bonding pads along edges of the second semiconductor chip;

a first bonding wire electrically connecting together one of the first bonding pads to one opposing end of one of the linear redistribution parts; and a second bonding wire electrically connecting together the other opposing end of the one of the linear redistribution parts to one of the second bonding pads.

2. The stack package as set forth in claim 1, wherein the pattern die is mounted onto the first semiconductor chip without covering any of the first bonding pads of the first semiconductor chip.

3. The stack package as set forth in claim 1, wherein the second semiconductor chip is mounted onto the pattern die such that all of the opposing end parts of each of the linear redistribution parts of the pattern die are exposed.

4. The stack package as set forth in claim 1, wherein the one of the first bonding pads and the one opposing end of one of the linear redistribution parts are located adjacent to each other, and wherein the other opposing end of the one of the linear redistribution parts and the one of the second bonding pads are located adjacent to each other.

5. The stack package as set forth in claim 1 further comprising an adhesive layer adhering together the first semiconductor chip to the pattern die.

6. The stack package as set forth in claim 1 further comprising an adhesive layer adhering together the second semiconductor chip to the pattern die.

* * * * *